United States Patent [19]

Jacobson et al.

[11] Patent Number: 5,694,399

[45] Date of Patent: Dec. 2, 1997

[54] PROCESSING UNIT FOR GENERATING SIGNALS FOR COMMUNICATION WITH A TEST ACCESS PORT

[75] Inventors: Neil G. Jacobson, Mountain View; Anthony S. Maraldo, Campbell, both of Calif.

[73] Assignee: Xilinix, Inc., San Jose, Calif.

[21] Appl. No.: 631,766

[22] Filed: Apr. 10, 1996

[51] Int. Cl.[6] .................................................... G01R 31/28
[52] U.S. Cl. ...................... 371/22.3; 371/25.1; 395/200.1
[58] Field of Search .................................. 371/22.3, 22.1, 371/22.5, 25.1, 22.6; 395/575, 275, 200.18; 324/158 R, 73.1, 765; 364/481

[56] References Cited

U.S. PATENT DOCUMENTS

| | | | |
|---|---|---|---|
| 5,228,045 | 7/1993 | Chiles | 371/22.3 |
| 5,343,478 | 8/1994 | James et al. | 371/22.3 |
| 5,355,369 | 10/1994 | Greenberger Alan et al. | 371/22.3 |
| 5,428,624 | 6/1995 | Blair et al. | 371/22.3 |
| 5,428,750 | 6/1995 | Hsieh et al. | 395/275 |
| 5,483,518 | 1/1996 | Whetsal | 370/13 |

OTHER PUBLICATIONS

IEEE Computer Society, "IEEE Standard Test Access Port and Boundary-Scan Architecture" IEEE Std 1149.1-1990, Copyright 1993 by the Institute of Electrical and Electronics Engineers, Inc. 345 East 47th Street, New York, NY 10017.

*Primary Examiner*—Robert W. Beausoliel, Jr.
*Assistant Examiner*—Nadeem Iqbal
*Attorney, Agent, or Firm*—Anthony C. Murabito; Wagner, Murabito & Hao; Jeanette S. Harms

[57] ABSTRACT

A system for interfacing with a test access communication port. Specifically, the present invention has application to the IEEE 1149.1 Test Access Port ("JTAG") standard. The novel system includes a hardware unit having a memory unit and a special processor unit (SPU) that interfaces between the test access port and components of a general purpose host computer system. The host computer system uses software procedures to formulate a set of compressed instructions instructing the hardware unit to generate and/or receive signals in connection with the test access port. In one embodiment, the host computer system contains configuration data in a special format. The host computer system translates this configuration data into the compressed instructions which are transmitted to the hardware unit causing it to download the configuration data using signals recognized by the test access port. The data is downloaded into a programmable integrated circuit device using the test access port. The SPU contains circuitry to expand the compressed instruction to generate the appropriate driving and receiving signals of the test access port. In one embodiment, clock, state machine, and data-in signals are generated by the SPU while a data-out signal can be received and relayed to the host computer system. The host computer system can be of a number of well known platforms (e.g., x86, DEC Alpha, Power PC, Mips, RISC, etc.).

21 Claims, 9 Drawing Sheets

PROCESSING UNIT FOR GENERATING SIGNALS FOR COMMUNICATION WITH A TEST ACCESS PORT

BACKGROUND OF THE INVENTION

1. Field of the Invention

The present invention relates to the field of communication interfaces. Specifically, the present invention relates to the field of providing communication with a test access port of an electronic device.

2. Background Art

Programmable integrated circuits such as field programmable gate arrays (FPGAs) and programmable logic devices (PLDs), and complex programmable logic devices (CPLDs) require programming for operation. The data used to program or configure these devices is often referred to as configuration data. In the past, special purpose dedicated computer systems were used to download the configuration data into these devices to program them. However, the use of special purpose or dedicated computer systems to perform device programming is not economically advantageous at least because (1) dedicated computer systems are expensive and (2) dedicated computer systems are additive for users that already have a general purpose computer system. Therefore, what is needed is a low cost mechanism which allows a general purpose computer system to program programmable integrated circuit devices.

Modern integrated circuits (test device) have elaborate mechanisms for testing the functionality of their internal circuits. The test mechanisms include different standard communication interfaces used for transmitting test information and status information between the test device and a host computer system. One standard communication mechanism used for test purposes is the IEEE Std 1149.1-1990 (including the IEEE Std 1149.1a-1993) Test Access Port (TAP) standard often called the "JTAG" standard. The JTAG standard is particularly useful because it is a serial data input communication interface and requires only a few input/output lines. Therefore, fewer input/output pads are required of the test device to implement the JTAG standard. The JTAG communication interface is typically driven by a dedicated computer system to test the functionality of the test device.

However, modern general purpose computer systems do not support any direct interface for the JTAG standard. Therefore, what is needed is a programming mechanism that readily interfaces with a general purpose host computer system to ease problems associated with configuring a programmable integrated circuit test device that is JTAG compatible.

Lastly, many present systems for loading configuration data into a programmable integrated circuit employ a serial data transmission mechanism whereby serial data leaves the host system and enters the programmed device. Use of serial transmission results in long transmission time as every bit in the configuration stream is individually maintained and transmitted by the host system. What is needed is a configuration data transmission mechanism that provides data compression.

Accordingly, it is an advantage of the present invention to provide a system for interfacing a general purpose computer system to a programmable integrated circuit. It is further an advantage of the present invention to utilize the JTAG standard to provide this communication interface. It is also an advantage of the present invention to utilize the above communication system for communicating configuration information from a general purpose host computer system to a programmable integrated circuit device and for receiving input signals from said programmable integrated circuit over the JTAG standard. It is also an advantage of the present invention to provide configuration data compression during host transmission. The present invention provides the above mentioned advantageous functionalities as well as others not specifically recited above, but clear within discussions of the present invention below.

SUMMARY OF THE INVENTION

A system is described herein for interfacing with a test access communication port. Specifically, the present invention has application to the IEEE 1149.1 Test Access Port ("JTAG") standard. The system of the present invention includes a hardware unit having a memory unit and a special processor unit (SPU) that interfaces between the test access port and components of a general purpose host computer system. The general purpose host computer system uses software procedures to formulate a set of compressed instructions instructing the hardware unit to generate and/or receive signals over the test access port. In one embodiment, the general purpose host computer system contains configuration data in a special format. The general purpose host computer system translates this configuration data into the compressed instructions which are transmitted to the hardware unit causing it to download the configuration data using signals recognized by the test access port. The data is downloaded into a programmable integrated circuit device using the test access port. The SPU contains circuitry to expand the compressed instructions to generate the appropriate driving and receiving signals of the test access port. In one embodiment, clock, state machine, and data-in signals are generated by the SPU while a data-out signal can be received and relayed to the general purpose host computer system. The general purpose host computer system can be of a number of well known platforms (e.g., x86, DEC Alpha, Power PC, Mips, RISC, etc.).

Specifically, embodiments of the present invention include an interface circuit having: a receiver circuit for receiving instructions over a first interface, the first interface for communicating with a general purpose host computer system; a control circuit for decoding the instructions and responsive thereto for generating TCK, TDI, and TMS signals for transmission over a second interface and for receiving second signals from the second interface, the control circuit having: a TCK generator circuit coupled to an instruction data bus and coupled to receive first control signals for generating the TCK signals over the second interface in response to decoded first and second instructions; a TDI generator circuit coupled to the instruction data bus and coupled to receive second control signals for generating the TDI signals over the second interface in response to the first instructions; and a TMS generator circuit coupled to the instruction data bus and coupled to receive third control signals for generating the TMS signals over the second interface in response to the second instructions; and wherein the second interface and the first and the second signals are for communicating with an access port of a programmable integrated circuit device and conform to the IEEE 1149.1 communication interface. The present invention also includes a communication system and method of loading information in accordance with the above.

DETAILED DESCRIPTION OF THE INVENTION

Notation And Nomenclature

Some portions of the detailed descriptions which follow are presented in terms of procedures, logic blocks, processing, and other symbolic representations of operations on data bits within a computer memory. These descriptions are the means used by those skilled in the data processing arts to effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient to refer to these signals as bits, values, elements, symbols, characters, terms, numbers, or the like.

However, these and similar terms are to be associated with the appropriate physical quantities they represent and are merely convenient labels applied to these quantities. Unless specifically stated otherwise as apparent from the following discussions, terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories and/or registers and/or other such information storage, transmission or display devices.

System Overview 50

Figure 1:
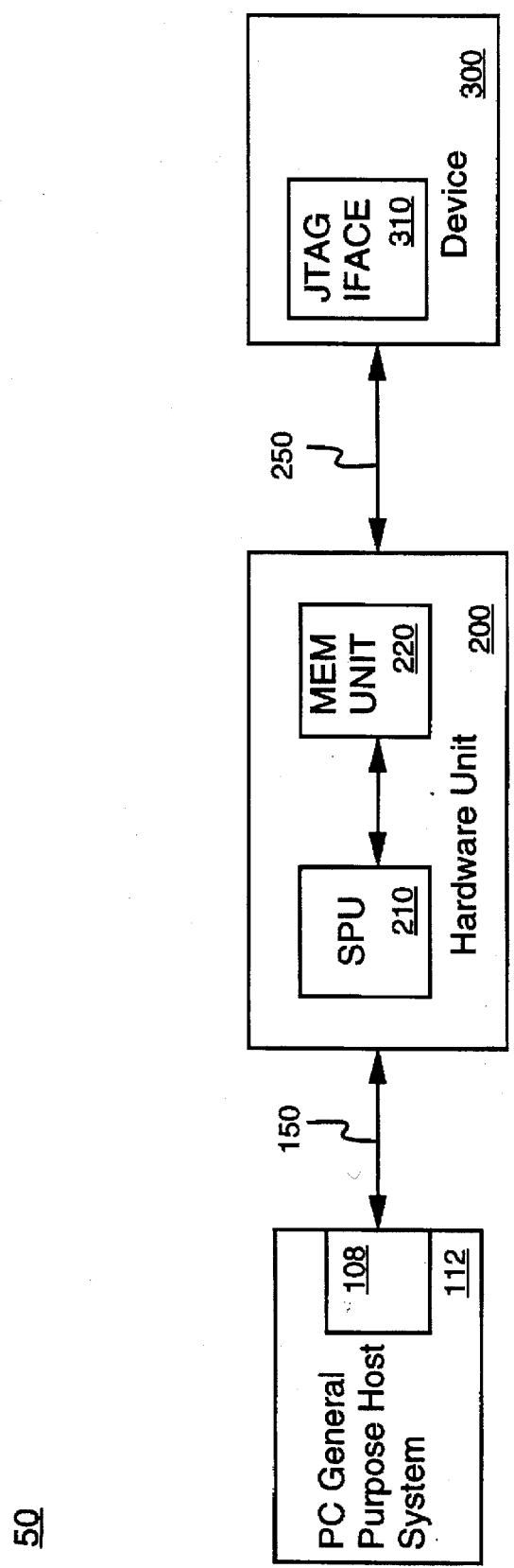
FIG. 1 is a block diagram of a system of the present invention using the test access port of a test device and a general purpose host computer system.

With reference to FIG. 1, an overview diagram of the communication system 50 of the present invention is shown. System 50 includes a general purpose host computer system 112 having a communication interface port (e.g., a parallel or serial port) 108. System 112 is coupled to a hardware unit 200 of the present invention using a first interface 150. Interface 150 conforms to the type of communication interface port 108 used by system 112 (e.g., serial or parallel). The hardware unit 200 contains a special processor unit (SPU) 210 and a volatile memory unit 220 which are communicatively coupled together. The hardware unit 200 of the present invention is coupled to a programmable integrated circuit device 300 using second interface 250. In one embodiment of the present invention, interface 250 conforms to the IEEE 1149.1 Test Access Port or "JTAG" standard for communication interfaces and device 300 contains a JTAG interface port 310 which is coupled to interface 250.

As discussed in more detail below, the hardware unit 200 provides a communication interface between the general purpose host computer system 112 and a device 300 having a JTAG interface port 310. In one embodiment, this communication interface circuit 200 is effectively used to configure (e.g., program) device 300 with configuration data where device 300 is a programmable integrated circuit (e.g., an FPGA, PLD, CPLD, etc.). By allowing a general purpose host computer system 112 to perform the above programming, the present invention advantageously avoids using a costly dedicated host computer system.

Figure 2:
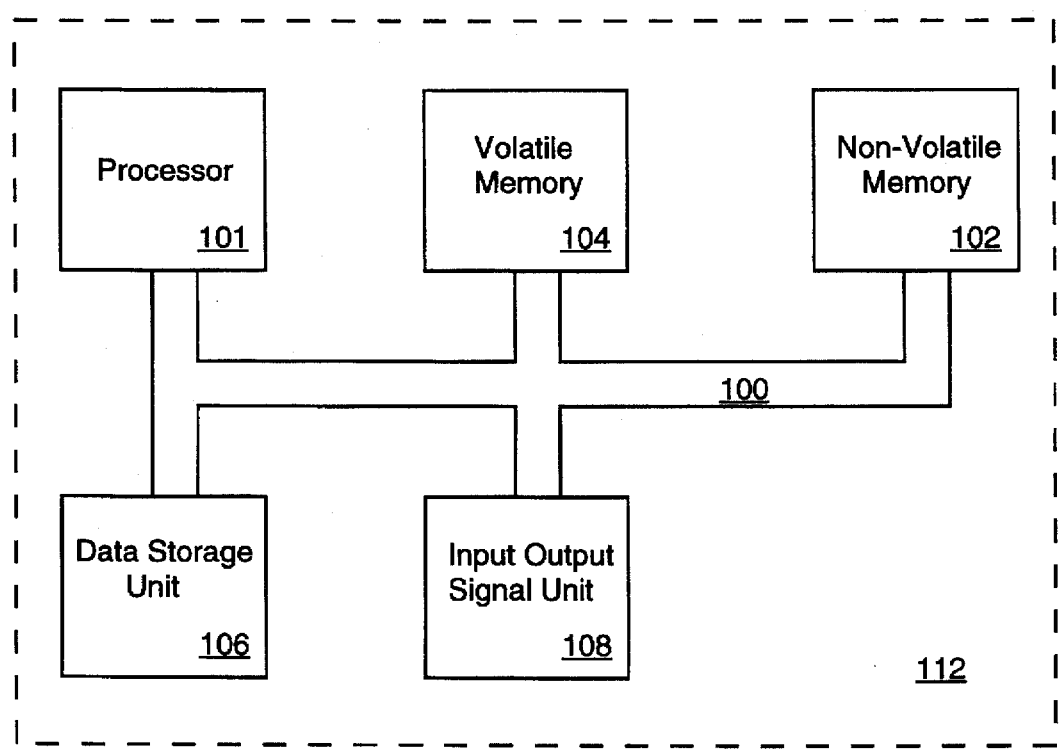
FIG. 2 is a block diagram of a general purpose host computer system used in accordance with the present invention.

FIG. 2 illustrates a block diagram of components of the general purpose host computer system 112 of the present invention. System 112 contains a processor 101 for processing information and instructions and can be of a number of well known architectures (e.g., x86, Power PC, DEC Alpha, Mips, RISC, etc.). Processor 101 is coupled to an address/data bus 100 (e.g., a VMX bus, ISA bus, ESA bus, PCI bus, etc.). Also coupled to bus 100 is a computer readable volatile memory unit 104 (e.g., random access memory) for storing dynamic information for processor 101 and a computer readable non-volatile memory unit 102 (e.g., read only memory, flash memory, EEPROM, PROM, EPROM, etc.) for storing static information for processor 101. System 112 also includes a computer readable data storage device 104, such as a magnetic or optical disk and disk drive, coupled with bus 100 for storing information and instructions. In one embodiment of the present invention, system 112 also includes a communication interface port or unit 108. Interface port 108 uses either parallel or serial (e.g. RS-232, RS-432, etc.) protocol and can be realized using a number of well known circuits within the scope of the present invention. Alternatively, within one embodiment of the present invention, port 108 is eliminated and the SPU 210 of hardware unit 200 (FIG. 1) is directly interfaced with bus 100 (e.g., using a microcontroller interface). Either of the implementations described above can be used to allow the general purpose computer system 112 to interface with the hardware unit 200.

Figure 3:
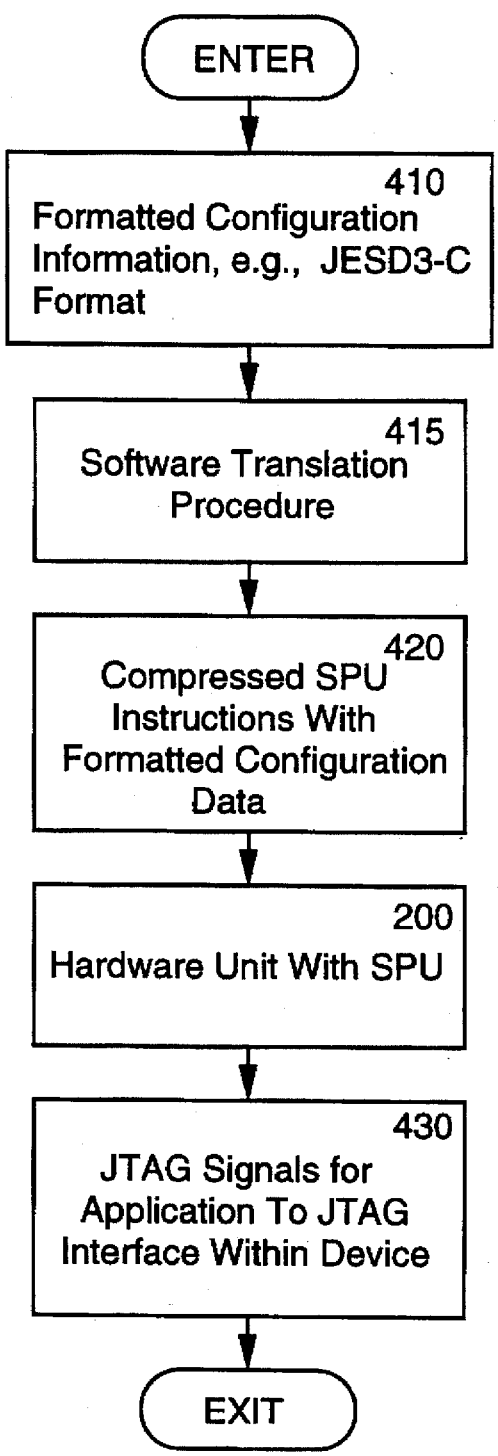
FIG. 3 is a flow chart illustrating data flow between different layers of the present invention.

FIG. 3 illustrates a data/process flow diagram of a method 400 used by system 50 (FIG. 1) to configure an integrated circuit device 300 using the JTAG communication interface ("JTAG interface") in accordance with the present invention. Configuration information 410 resides within system 112 in a format that does not typically conform to the JTAG standard. Rather, the configuration information 410 is typically stored within a format output by automatic generation software used by a developer in creating the configuration data for the programmable integrated circuit device 300. One such format is the JESD3-C format. For an FPGA, the configuration information 410 is used to program configurable logic blocks (CLBs) and programmable interconnects (e.g., programmable interconnect points, anti-fuses) within the FPGA 300. For a CPLD, the configuration information 410 is used to program macrocells and programmable interconnects (e.g., switch connections) within the CPLD 300.

Software translation procedures 415, to be described further below, are executed by system 112 to translate the configuration information 410 into a second format including compressed instructions to be executed by hardware unit 200. The instructions include specially formatted configuration data. It is appreciated that the present invention provides configuration data compression by using a small set of compressed instructions wherein each instruction represents a larger set of coded configuration data. At the completion of process 415, a set of compressed SPU instructions 420 is stored in memory units of system 112. These instructions are sent over interface 150 (FIG. 1) to the hardware unit 200. The SPU 210 of the present invention decodes these instructions 420 and generates conforming JTAG interface signals 430 which are driven over interface 250 to the JTAG interface port 310 of device 300.

Instructions Recognized By SPU 210

The SPU 210 (FIG. 1) of the present invention recognizes a set of command words or instructions 420 for generating JTAG conforming signals over interface 250 and for recording JTAG signals received over interface 250. The instructions 420 define specific programmable bit patterns and repeated bit sequences that are to be applied to interface 250 when the instructions are executed by hardware unit 200. Rather than require that each stimulus bit be individually transmitted to the SPU 210, the SPU 210 decodes a series of these compressed instructions 420 which are expanded to generate the required individual stimulus over interface 250. An exemplary set of instructions 420 with related syntax is presented below. However, it is appreciated that the following instructions are exemplary of one embodiment of the present invention and that other instruction formats can be used within the scope of the present invention.

Command Word 0

Command Word 0 has eight bits in the following encoded format:

| Bit | Description |
| --- | --- |
| 0 | Encoded bit 0 |
| 1 | Encoded Bit 1 |
| 2 | TDI signal value (Test Data Input to Device 300) |
| 3 | TMS signal value (Test Mode Select) |
| 4 | TCK signal value (Test Clock) |
| 5 | 0 |
| 6 | 0 |
| 7 | 0 |

Bits 5–7 encode this word as command word 0. When SPU 210 is configured in the manual mode, the values received in bit positions 2–4 are applied over the JTAG interface 250 assert the TDI, TMS, and TCK lines with the values (0/1) stored therein. The four configurations of bits 0–1 cause SPU 210 to (1) clear an address pointer to memory 220 (FIG. 6), (2) relay certain status information to the host system 112, (3) toggle on or off capture mode for capturing TDO information (Test Data Output from device 300), and (4) upload stored TDO information from memory 220.

Command Word 1

Command Word 1 has eight bits in the following encoded format:

| Bit | Description |
| --- | --- |
| 0 | AUTO/MANUAL mode |
| 1 | CLK0 |
| 2 | CLK1 |
| 3 | BAUD0 |
| 4 | BAUD1 |
| 5 | 1 |
| 6 | 0 |
| 7 | 0 |

Bits 5–7 encode this word as command word 1. Bit 0 defines whether SPU 220 is in manual or automatic mode. Bits 1–2 define the speed of the system clock used to clock internal circuitry of SPU 220 (e.g., 5.5, 11, 22, and 0.921 MHz, as examples). In an alternative embodiment, only two clock rates are selectable. Bits 3–4 indicate the baud rate used to communicate with the host system 112 when a serial interface 150 is used (e.g., 9,600, 19,200, 38,400, and 115,200 baud, as examples).

Command Word 2

Command Word 2 has eight bits in the following encoded format:

| Bit | Description |
| --- | --- |
| 0 | 1st TDI bit value |
| 1 | 2nd TDI bit value |
| 2 | 3rd TDI bit value |
| 3 | 4th TDI bit value |
| 4 | Last TDI bit value |
| 5 | 0 |
| 6 | 1 |
| 7 | 0 |

Command Word 2 is used to load a particular sequence of TDI bits into device 300. Bits 5–7 define this word as command word 2. Bits 0–4 represent a bit sequence to be shifted over the TDI line of interface 250. As this bit sequence is output, the TCK line of interface 250 is toggled five times in synchronization with the TDI bit values in a JTAG conforming sequence.

Command Word 3

Command Word 3 has eight bits in the following encoded format:

| Bit | Description |
| --- | --- |
| 0 | 1st TMS bit value |
| 1 | 2nd TMS bit value |
| 2 | 3rd TMS bit value |
| 3 | 4th TMS bit value |
| 4 | Last TMS bit value |
| 5 | 1 |
| 6 | 1 |
| 7 | 0 |

Command Word 3 is used to load a particular sequence of TMS bits into device 300. Bits 5–7 define this word as command word 3. Bits 0–4 represent a bit sequence to be shifted over the TMS line of interface 250. As this bit sequence is output, the TCK line of interface 250 is toggled five times in synchronization with the TMS values in a JTAG conforming sequence.

Command Word 4

Command Word 4 has eight bits in the following encoded format:

| Bit | Description |
| --- | --- |
| 0 | First TDI value |
| 1 | First TMS value |
| 2 | Second TDI value |
| 3 | Second TMS value |
| 4 | R, a repeat value |
| 5 | 0 |
| 6 | 0 |
| 7 | 1 |

Command Word 4 is used to load a particular sequence of bits into device 300. Bits 5–7 define this word as command word 4. Bits 0–1 represent values of TDI and TMS that are first output simultaneously with a TCK transition. Bits 2–3 represent values of TDI and TMS that are simultaneously output following bits 0–1 and are output simultaneously with a TCK transition. If bit 4 is set, the above sequence repeats once more.

Command Word 5

Command Word 5 has eight bits in the following encoded format:

| Bit | Description |
| --- | --- |
| 0 | LSB of repeat value, b0 |
| 1 | Repeat bit1 |
| 2 | Repeat bit2 |
| 3 | MSB of repeat value, b4 |
| 4 | TDI bit |
| 5 | 1 |
| 6 | 0 |
| 7 | 1 |

Command Word 5 is used to load a repeated bit sequence into device 300. Bits 5–7 define this word as command word 5. Bit 4 indicates a single TDI bit value to be output over the TDI line of interface 250 and this value is repeated by an incorporated repeat value defined by bits 0–3. The TCK line transitions upon each TDI value repeated. If the repeat value is zero, then an eight bit word following command word 5 defines the incorporated repeat value (e.g., R0 to R7).

Command Word 6

Command Word 6 has eight bits in the following encoded format:

| Bit | Description |
| --- | --- |
| 0 | LSB of repeat value, bit0 |
| 1 | Repeat bit1 |
| 2 | Repeat bit2 |
| 3 | MSB of repeat value, bit4 |
| 4 | TMS bit |
| 5 | 0 |
| 6 | 1 |
| 7 | 1 |

Command Word 6 is used to load a repeated bit sequence into device 300. Bits 5–7 define this word as command word 6. Bit 4 indicates a TMS value to be output over the TMS line of interface 250 and this value is repeated by an incorporated repeat value defined by bits 0–3. The TCK line transitions upon each TMS value repeat. If the repeat value is zero, then an eight bit word following command word 6 defines the incorporated repeat value (e.g., R0 to R7).

Command Word 7

Command Word 7 has eight bits in the following encoded format:

| Bit | Description |
| --- | --- |
| 0 | LSB of repeat value, bit0 |
| 1 | Repeat bit1 |
| 2 | MSB of repeat value, bit3 |
| 3 | TDI bit value |
| 4 | TMS bit value |
| 5 | 1 |
| 6 | 1 |
| 7 | 1 |

Command Word 7 is used to load a repeated bit sequence into device 300. Bits 5–7 define this word as command word 7. Bits 0–2 represent an incorporated repeat value. Bit 3 indicates a value output over TDI of interface 250 and bit 4 represents a value simultaneously output over TMS of interface 250. Bit 3 and bit 4 are repeated over interface 250 a number of times defined by the repeat value. If the incorporated repeat value equals zero, the repeat value is defined by a second word following this command (e.g., R0 to R7).

Hardware Unit 200

Figure 4:
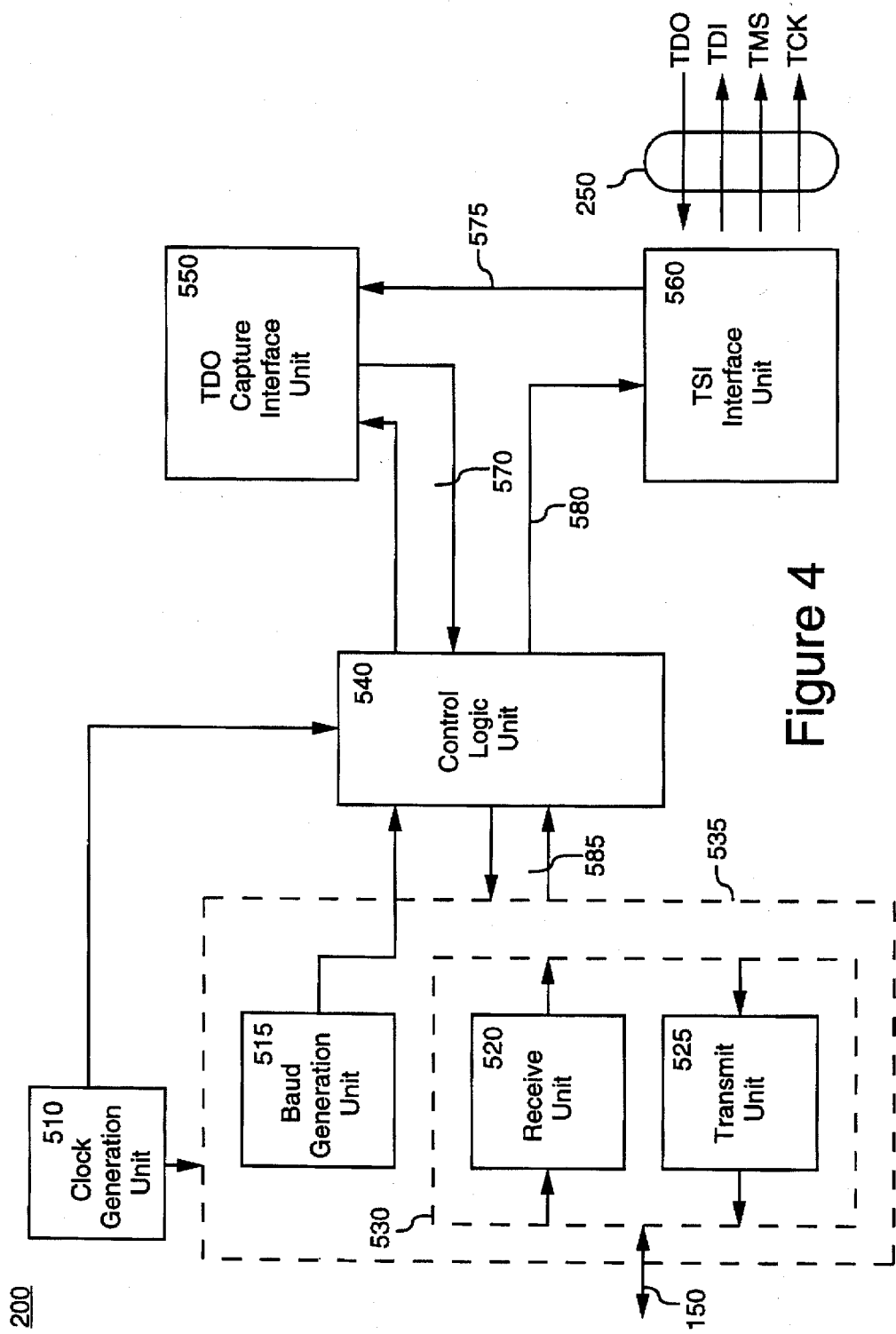
FIG. 4 is a circuit diagram of the special processor unit in accordance with the present invention.

FIG. 4 is a block diagram of the circuitry of hardware unit 200 of the present invention. While memory 220 is located within unit 550, the remainder of FIG. 4 represents SPU 210. SPU 210 executes the instructions shown above to generate signals over JTAG interface 250.

JTAG interface 250 is well known and is composed of four signals with four corresponding lines (TDO, TDI, TMS, and TCK), see IEEE 1149.1-1990 standard. The TDO line carries the test data output signal and represents data signals serially output from device 300 (FIG. 1) to hardware unit 200. TDI is the test data input line and is used to stream serial data and instruction information into device 300. TCK is the test clock signal line and provides the clocking signals for the device 300 and for data transmitted over interface 250. TMS is the test mode select line and is used to transmit state change information over interface 250. As described in the IEEE 1149.1-1990 standard (see p. 5-1) a TAP controller within JTAG interface port 310 (FIG. 1) moves from state to state within a state machine based on signals received over the TMS line. Only the TDO line inputs information to hardware unit 200 from device 300.

Interface 250 is coupled to a target system interface unit 560 of hardware unit 200. Interface unit 560 buffers input and output signals over interface 250. It is appreciated that unit 560 receives TDI, TMS, and TCK signals over lines 580b, 580c and 580d, respectively, of bus 580 which are generated by control logic unit 540. When driving these signals over interface 250 to device 300, unit 560 insures that the timing of these signals conforms to the JTAG interface standard. In effect, unit 560 insures that the TDI and TMS signals are stable upon the appropriate transition of the TCK clock. Unit 560 also routes TDO signals detected over interface 250 to a TDO capture interface unit 550 using bus 575. In one embodiment, bus 575 is a serial line.

FIG. 4 illustrates a clock generation unit 510 coupled to supply a system clock to the control logic unit 540. Although a number of clock frequencies can be used within the scope of the present invention, in one embodiment, unit 510 is capable of generating at least four clock signals which are selectable at frequencies of 0.921, 5.5, 11, and 22 MHz. Other connections (not shown) supply the system clock from unit 510 to communication unit 535, unit 550, and unit 560.

Communication unit 535 is coupled to control logic unit 540 via bus 585 and contains a baud rate generator circuit 515 controlled by unit 540. Circuit 515, coupled to unit 520 and 525, maintains the communication baud rate over interface 150 with the host system 112 within the embodiment using serial communication. Although a number of baud frequencies can be used within the scope of the present invention, in one embodiment, circuit 515 is capable of generating at least four baud rates which are selectable at 9,600, 19,200, 38,400, and 115,200 baud. A number of well known circuits can be used as circuit 515. Unit 535 also contains a receiver unit 520 and a transmit unit 525 which conform to the communication protocol used for interface 150. Embodiments using a serial protocol as interface 150 employ a UART circuit 530 having serial units 520 and 525. The UART circuit 530 can be of a number of well known types (e.g., RS-232, RS-242 format). A standard printer protocol interface can be used as unit 530 for embodiments that implement a parallel interface protocol as interface 150.

It is appreciated that the compressed instructions, as described above (e.g., commands 0 to 7), are received by hardware unit 200 from the host system 112 using unit 535.

The TDO capture interface unit 550 of FIG. 4 records values received over the TDO line of interface 250 when capture mode is enabled with the SPU 210. The TDO values are recorded into memory 220 (FIG. 1) and select addresses can be addressed by the control logic unit 540, e.g., via address signals presented over address/data bus 570, for reporting TDO values to the host system 112. Among other items, TDO data can represent: 1) device 300 status; 2) configuration data stored in device 300; 3) identification information; or 4) test data within device 300. TDO data is returned over address/data bus 570 to the control logic unit 540.

The central control unit for SPU 210 is control logic unit 540 Of the present invention which receives compressed instructions from host system 112 over interface 150 via communication unit 535 and bus 585. Unit 540 translates some of these instructions into an expanded set of TDI, TMS, and TCK signals which are transmitted to unit 560 which drives them over the JTAG interface 250. Other commands are translated into functions which alter the operation of the hardware unit 200 (e.g., to change baud rates, select system clocks, select operational modes, enable TDO capture mode, etc.). Lastly, other commands are translated into functions which retrieve captured TDO information from memory 220 and report this information to the host system 112, other commands are used for reporting status information from device 300 to the host system 112.

Figure 5:
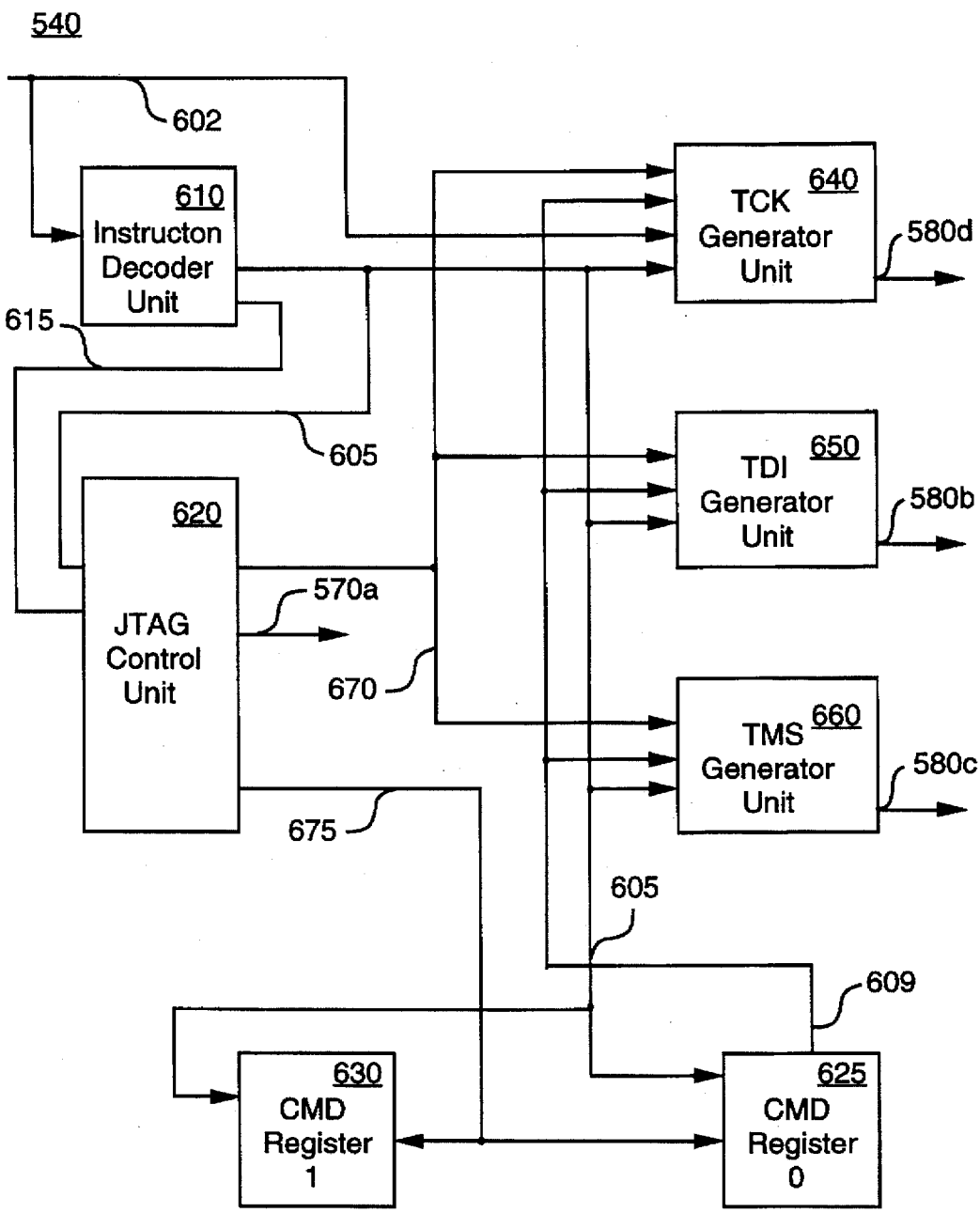
FIG. 5 is a circuit diagram of the control logic unit in accordance with the present invention.

FIG. 5 illustrates a circuit diagram of the control logic unit 540 which is synchronized to the system clock. Control logic unit 540 contains a decoder unit 610 which receives, over instruction bus 602, the syntax of the above described compressed instructions. In one embodiment, eight bits define the syntax of an instruction word so bus 602 is eight bits wide. Bus 602 is a part of bus 585 (FIG. 4). Decoder unit 610 generates command signals over bus 615 which indicate which command word was received over instruction bus 602. In one embodiment, one of eight signals is transmitted over bus 615 for each received instruction. Unit 610 also generates signals over instruction data bus 605 which indicates the data portion of each compressed instruction. In one embodiment, the instruction data represents the least significant 5 bits of the instruction syntax while the command word is defined by the most significant bits. It is appreciated that a number of well known decoder circuits can be used to realize unit 610.

Figure 6:
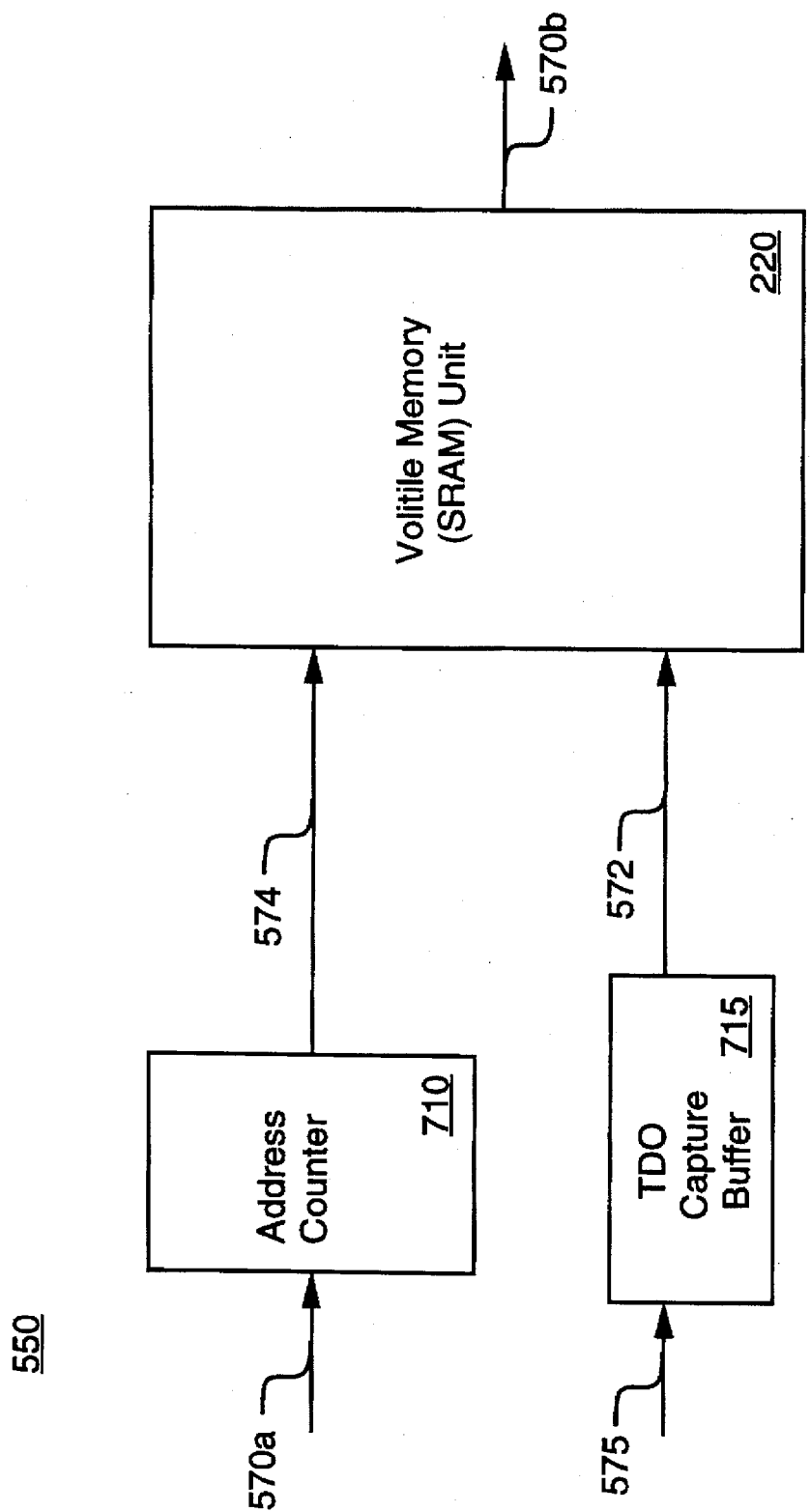
FIG. 6 is a circuit diagram of the TDO capture interface unit in accordance with the present invention.

A JTAG control unit 620 generates control signals over control bus 670 depending on the command signals received over bus 615 and the data information received over instruction data bus 605. The control bus 670 is coupled to a TCK generator unit 640, a TDI generator unit 650, and a TMS generator circuit 660 and separate control signals are generated by JTAG control unit 620 to control each of the above units 640, 650, and 660. Additionally, a second control bus 675 is coupled to command register0 625 and command register1 630 to supply control signals generated by JTAG control unit 620. Unit 620 also generates address and control information over bus 570a which is used by an address counter 710 (FIG. 6). Unit 620 of FIG. 5 is instrumental in controlling the generation of TCK, TDI and TMS signals driven over interface 250 by controlling units 640, 650 and 660, respectively. By controlling registers 625 and 630, unit 620 also controls setting hardware unit 200 in special operational modes and configuring system clock and baud rates. Unit 620 also controls reporting of captured TDO information to the host system 112 by generating address signals over bus 570a.

Provided decoder unit 610 of FIG. 5 indicates that the input compressed instruction is command5, command6, or command 7, if the incorporated repeat value is zero, the JTAG control unit 620 determines that the next received instruction word is an eight bit repeat value for the TCK generator unit 640. This value is output over bus 602 and a corresponding control signal is generated over control bus 670. JTAG control unit 620 also relays the current value of the TCK, TDI and TMS output values (580d, 580b, and 580c) to the host computer system 112 if the appropriate bit is set within command register0 625 requesting this information. When in manual mode, JTAG control unit 620 controls the supply of the TCK, TDI and TMS values from command register0 to units 640, 650, and 660 using bus 609 and appropriate control signals over control bus 670.

TCK generator unit 640 receives the least significant 5 data bits of a compressed instruction over instruction data bus 605, receives the entire instruction syntax over bus 602, and receives manual mode information over bus 609. Unit 640 receives control information over bus 670. Based on these inputs, unit 640 generates a JTAG conforming TCK clock signal over line 580d of bus 580 for a determined number of times. TDI generator unit 650 and TMS generator unit 660 are individually coupled to control bus 670. Unit 650 and unit 660 are each also coupled to bus 605 to receive the least significant 5 data bits of the instruction word and are further coupled to bus 609 to receive manual mode information. Unit 650 generates data input (TDI) signals over bus 580b and unit 580c generates test mode select (TMS) signals over bus 580c.

Command register0 625 and command register1 630 are each coupled to bus 605 to receive the least significant bits of the compressed instructions and each receive control bus 675 which supplies a write signal. Command register0 625 indicates: 1) the TMS, TDI and TCK data values for manual mode operation; 2) whether or not TDO capture mode is enabled; 3) an address clear bit for the TDO capture buffer; 4) an upload bit for the TDO capture buffer; and 5) a status request bit. This information is loaded into register 625 from command word0 (described above). Command register0 625 outputs values for TMS, TDI and TCK over bus 609 during manual mode operation. Command register1 630 indicates: 1) whether hardware unit 200 is in automatic or manual signal generation mode; 2) the selected system clock rate; and 3) the selected baud rate for interface 150. This information is loaded into register 630 from command word1 (described above).

TDO Capture Interface Unit 550

TDO capture interface unit 550 of FIG. 4 is shown in more detail in FIG. 6. Unit 550 contains an address counter circuit 710 which receives address signals over bus 570a as well as an address clear signal. Circuit 710 addresses volatile memory unit 220 (e.g., a random access memory unit) over address bus 574. TDO data signals are received over bus 575 in serial protocol by the TDO capture buffer 715. Capture buffer 715 is a temporary buffer that receives TDO bits in series and outputs a parallel TDO word (e.g., 4, 8, 12, bits) over parallel data bus 572. When TDO capture mode is enabled, for each TDO word that is output over bus 572, the address counter outputs the appropriate address (e.g., in sequential order) over address bus 574 in synchronization with the TDO data. The address count value of counter 710 is then updated after the TDO data is stored. This process repeats. When TDO capture mode is disabled, TDO data over bus 575 is ignored and memory unit 220 is not accessed.

An address counter reset signal sent over bus 570a and originating from JTAG control unit 620 of control logic unit 540 causes address counter 710 to reset its address count value. When the TDO capture data is requested by the host system 112, an upload bit is set within command register0 625. This upload bit, when set, causes address counter 710 to reset and sequentially address the locations of memory unit 220. The addressed TDO data words are sequentially output over bus 570b and are channeled to the communication unit 535 which outputs the TDO data over interface 150 (using either serial or parallel transfer protocols) to the host system 112. A number of well known memory addressing techniques and components can be used by the present invention to perform this TDO upload function.

TCK Generator Unit 640

Figure 7:
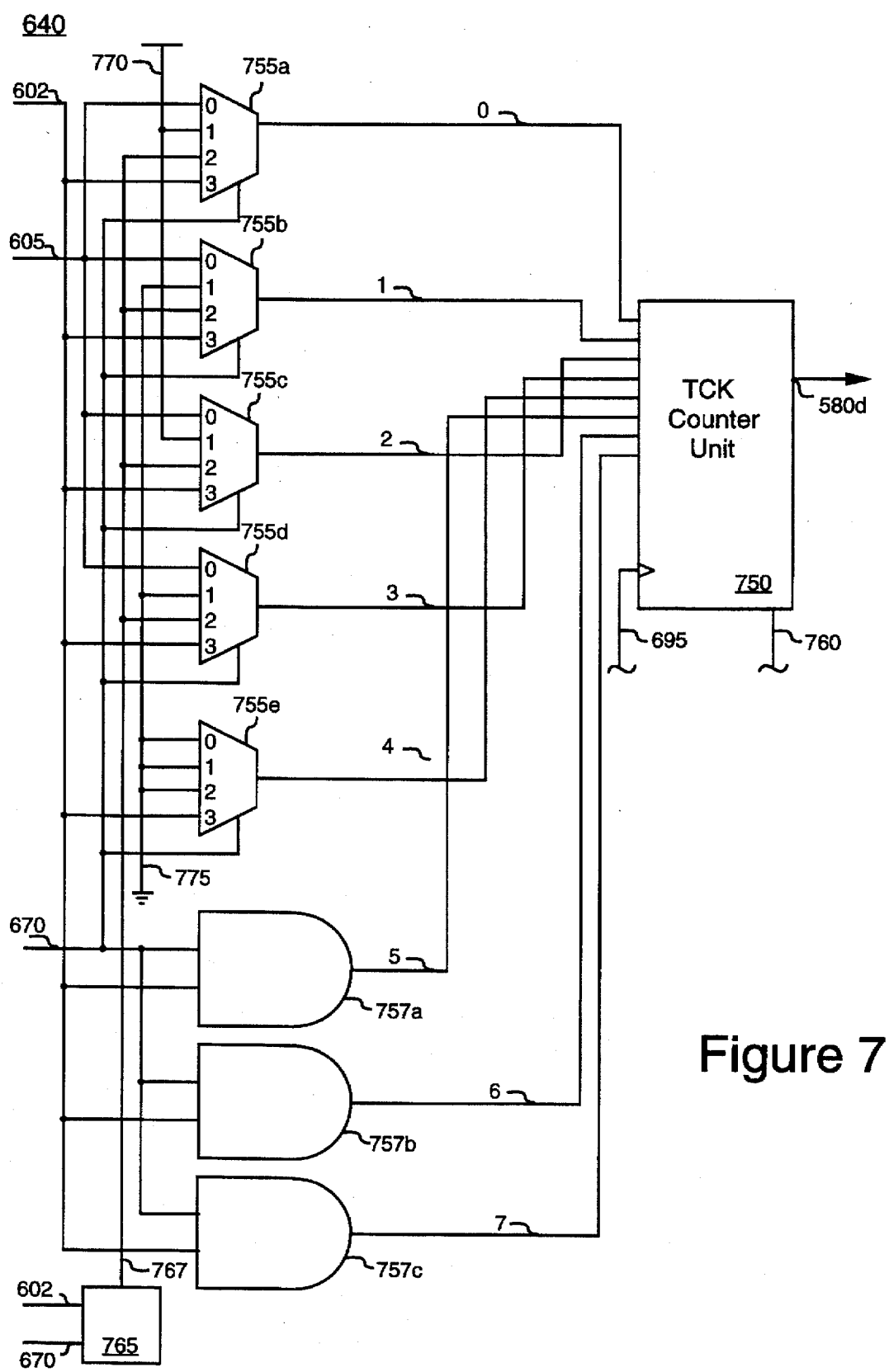
FIG. 7 is a circuit diagram of the TCK generator unit in accordance with the present invention.

FIG. 7 illustrates the TCK generator unit 640 of the present invention in more detail. Unit 640 contains a TCK counter unit 750 which is clocked by the system clock supplied over line 695. Line 760 is an enable signal and is also coupled to TCK counter unit 750. Unit 750 receives different count values (over bit lines 0–7) depending on the decoded compressed instructions. The TCK line 580d is pulsed for each serial data transfer over interface 250.

Although the present invention can operate with a number of different control circuits to supply the proper count value, one exemplary circuit is described below. However, it is understood that other well known circuits can be used to supply the proper count value to unit 750 depending on the compressed instructions. Unit 750 receives a series inputs representing a count value, in one embodiment five inputs (bit lines 0–4) are received from multiplexers (muxes) 755a–755e and represent the least significant bits of the input count value. In one embodiment, three inputs (bit lines 5–7) are received from AND gates 757a–757c which, when enabled, represent the most significant bits of the count value.

With respect to muxes 755a–755e of FIG. 7, in one embodiment, input port 3 of each is coupled to a respective data line of bus 602 such that mux 755a receives the LSB.

With respect to muxes 755a–755d, in one embodiment, input port 0 of each is coupled to bus 605 and input port 2 of each is coupled to output bus 767 of logic 765. Input port 1 of muxes 755a and 755c are coupled to logical "1" via line 770, while input port 1 of muxes 755b and 755d and input ports 0–2 of mux 755e are coupled to logical "0" via line 755. The upper most significant three bits of bus 602 are respectively coupled to one input of AND gates 757a–757c such that AND gate 757c receives the MSB. In one embodiment, bits of control bus 670 are coupled to the select lines of muxes 755a–755e and are also coupled to one input of AND gates 757a–757c. These bits supply first control signals to unit 640.

Lastly, logic 765 receives an input from bus 602 and from bus 670 and generates a signal over bus 767. Logic 765 generates the proper count value information for command word 4 based on control bus 670 and information received over bus 602.

The count value control circuit of FIG. 7 as described above is implemented such that the count values as shown in Table I are input to the TCK counter unit 750 depending on the received compressed instruction and its associated data. Based on the information of Table I, the control signals required of bus 670 (as generated by unit 620) can be readily formulated using well known techniques. It is appreciated that for each count within the count value of TCK counter unit 750, one clock transition over line 580d is generated in accordance with the JTAG interface standard.

TABLE I

| SELECT INPUT PORT OF AND GATES | | |
|---|---|---|
| MUXES 755 757 ENABLED? | | COUNT VALUE RECEIVED FROM |
| 0 | No | Bits 0–3 of Commands 5, 6, & 7. |
| 1 | No | Hardwired value of n, Commands 2 & 3 where n = 5 in one embodiment |
| 2 | No | Logic 765 supplies "1" mux 755b If Command 4 and R = 0 ("0" to other muxes of 755) and supplies "1" to mux 755c if Command 4 and R = 1 ("0" to other muxes of 755). |
| 3 | Yes | Bits 0–7 of Bus 602, used for optional second byte of Commands 5, 6, & 7. JTAG Control unit 620 generates appropriate control signal over bus 670 for this case |

It is appreciated that command words 2 and 3 utilize a fixed (e.g., implicit) TCK count value since n bits are used to represent the TDI and TMS data, in this embodiment n=5. However, the count values associated with other commands are explicit and are supplied within the data of the instruction. It is appreciated that for each command that requests TDI and TMS data output, a corresponding TCK count is required for each data bit. For instance, if a command requires 10 TDI bits to output, 10 TCK counts are required. In manual mode, TCK counter unit 750 is loaded with the count (0 or 1) stored in the command register0 and supplied over bus 609.

TDI Generator Unit 650

Figure 8:
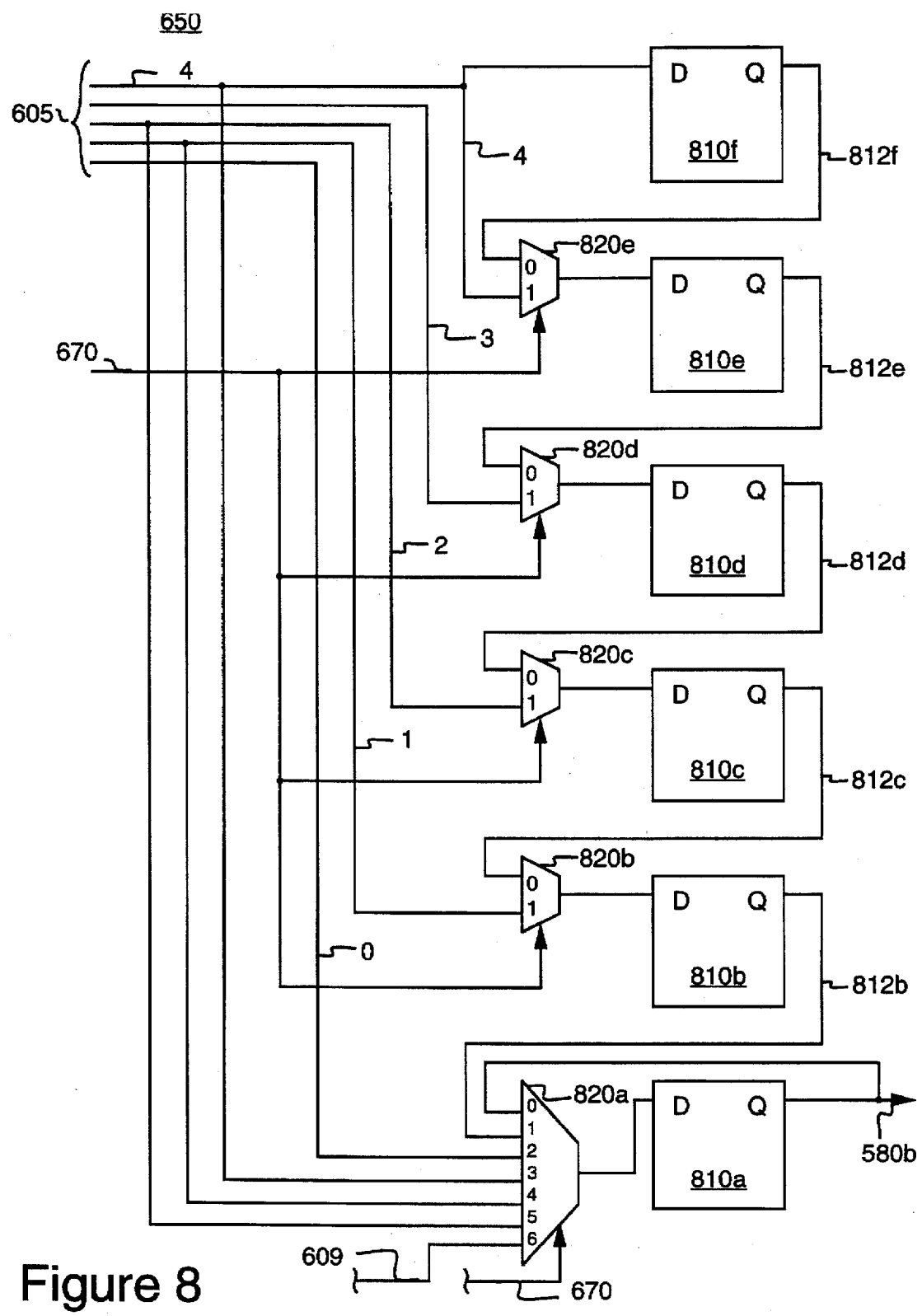
FIG. 8 is a circuit diagram of the TDI generator unit in accordance with the present invention.

FIG. 8 illustrates the TDI generator unit 650 in more detail. Unit 650 contains a group of serially coupled sequential cells (e.g., flip-flops) 810 that can also receive data supplied in parallel, depending on the decoded compressed instruction. Unit 650 can generate a series of discretely specified TDI values, or can generate a single TDI value held over a repeat count. Although the present invention can operate with a number of different control circuits to supply the proper values to the flip-flops 810, one particular exemplary circuit is described below. However, it is understood that other well known circuits can be used to supply the proper values to flip-flops 810 depending on the received compressed instruction.

With reference to FIG. 8, six individual flip-flops are used 810a–810f with flip-flop 810a coupled to supply the TDI output value over output Q coupled to line 580b. Although the maximum TDI pattern (e.g., command 2) that is supported by the instruction set described above is n, where n=5 in one embodiment, an extra flip-flop (n+1) is provided. The extra flip-flop is used so that the last TDI value of the pattern (e.g., bit 4) is held over line 580b after the TDI pattern is output, in accordance with the JTAG standard. The D input of 810f is coupled to bit 4 of bus 605. The D inputs of flop-flops 810b to 810e are coupled, respectively, to the output of muxes 820b–820e. The input of flip-flop 810a is coupled to the output of mux 820a.

The input port1 of muxes 820e to 820b are coupled, respectively, to bit 4, bit 3, bit 2, and bit 1 of bus 605. Bit 0 of bus 605 is coupled to input port2 of mux 820a. The input port0 of muxes 820e–820b are coupled, respectively, to the outputs of flop-flops 810f–812c. Further, the output of flip-flop 810b is coupled to input port1 of mux 820a. In this configuration, flip-flops 810f–810a act as a shift register when port0 of the muxes 820b–820e are selected and input port1 of mux 820a is selected. The select inputs of muxes 820a–820e are coupled to control bus 670. Muxes 820b–820e are coupled to one control line of bus 670 while mux 820a is controlled by three lines of bus 670. Input port3, port4 and port5 of mux 820a are coupled, respectively, to bit4, bit3, and bit2 of bus 605. Input port6 is coupled to bus 609 to receive the manual TDI stored in command register0 625. Input port0 of mux 820a is coupled to the output of mux 810a in a recirculation configuration.

Table II below illustrates the modes of operation for unit 650 of FIG. 8, depending on the received compressed instruction. Based on the information of Table II, the control signals required of bus 670 (as generated by unit 620) can be readily formulated using well known techniques.

TABLE II

| MUX 820b–e INPUT PORT | MUX 820a INPUT PORT | CONTROL CIRCUIT CONFIGURATION |
| --- | --- | --- |
| 1 | 2 | Parallel Data Load of Pattern, Command2 |
| 0 | 1 | Serial Shift Register, Command2 |
| X | 6 | Manual Model Command0 |
| X | 0 | Recirculate the last TDI value, Command3 and Command6 |
| X | 2 | Get Bit0 for First Sequence of Command4 |
| X | 5 | Get Bit2 for Second Sequence of Command4 |
| X | 3 | Get Bit4 for Command5 and Hold for Repeat Value |
| X | 4 | Get Bit3 for Command7 and Hold for Repeat Value |

X = Don't Care

During the first phase of command2, muxes 820 are configured such that bits 0–4 of bus 605 (TDI pattern) are loaded in parallel into the flip-flops 810e–810a with 810a having the LSB. Extra flip-flop 810f receives a duplicate of bit4 (bus 605). Muxes 820 are then configured to allow the TDI bits to be shifted through flip-flops 810 in serial fashion through 810a over bus 250b. In synchronization with the above serial shift process, the TCK generator unit 640 generates n TCK clock transitions, where n=5 in one embodiment. It is appreciated that TDI generator circuit 650 can be implemented to process more or less than five bits for command 2 by adding more flip-flops 810 or using only the downstream flip-flops to store a reduced sized pattern. For command3 and command6, TMS data is output by unit 660, so the last used TDI value that is held in flip-flop 810a is recirculated for each TCK pulse over the repeat count.

For command0, the manually entered TDI value is supplied over bus 609 and stored into flip-flop 810a and output over line 580b in synchronization with one TCK pulse. For command5 and command7, either bit4 or bit3 of bus 605 is input to flip-flop 810a and held there for a number of TCK pulses defined by the repeat value maintained by the TCK generator unit 640. A recirculation configuration (see Table II) can be used for the above function. For command4, the TDI value of bit0 (of bus 605) is stored in flip-flop 810a and output, next the TDI value of bit2 (of bus 605) is stored in flip-flop 810a and output. This process is repeated if bit4 (of bus 605) is set (one or two TCK pulses are used depending on the repeat value).

TMS Generator Unit 660

Figure 9:
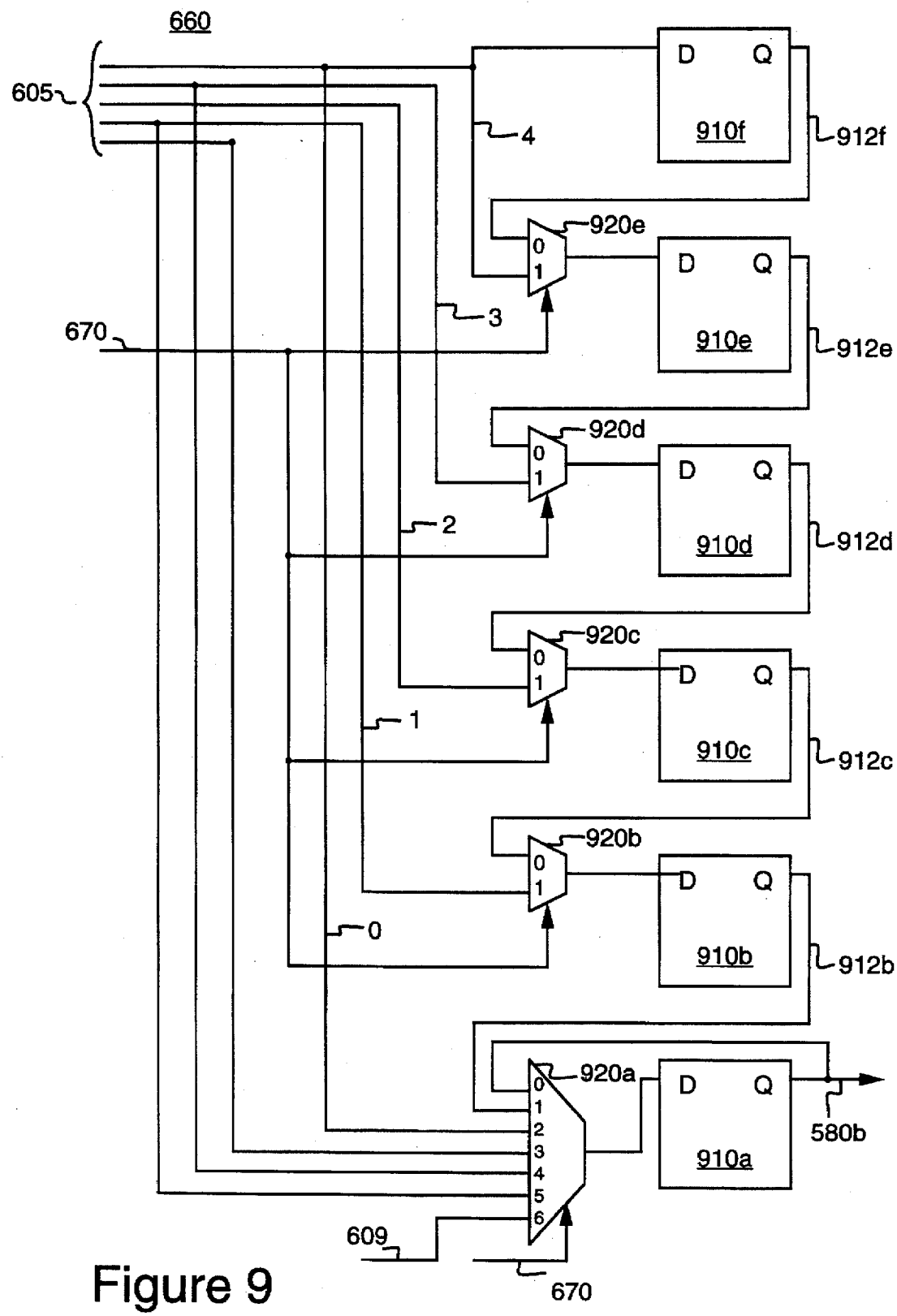
FIG. 9 is a circuit diagram of the TMS generator unit in accordance with the present invention.

FIG. 9 illustrates the TMS generator unit 660 in more detail. Unit 660 can generate a series of discretely specified TMS values, or can generate a single TMS value held over a repeat count. Although the present invention can operate with a number of different control circuits to supply the proper values to the flip-flops 910, one particular exemplary circuit is described below. However, it is understood that other well known circuits can be used to supply the proper values to flip-flops 910 depending on the received compressed instruction.

Unit 660 contains sequential cells (e.g., flip-flops) 910f–910b and muxes 920e–920b which are coupled together and coupled to lines of bus 605 in a fashion analogous to corresponding structures of the TDI generator circuit 650 of FIG. 8. However, different control lines over bus 670 are used to control the muxes 920a–920e. One control line is coupled to each mux of 920b–920e and three lines are used to control mux 920a. Signals over these control lines 670 (originating from unit 620) can be realized using well known techniques from the information presented in Table III below. Like TDI generator unit 650, the TMS generator unit 660 contains six (e.g., n+1) flip-flops 910 so that the last TMS value output over line 580c is held over this line until a new TMS value is output, in accordance with the JTAG interface standard.

Table III below illustrates the modes of operation for unit 660 of FIG. 9, depending on the received compressed instruction.

TABLE III

| MUX 920b–e INPUT PORT | MUX 920a INPUT PORT | CONTROL CIRCUIT CONFIGURATION |
| --- | --- | --- |
| 1 | 3 | Parallel Data Load of Pattern, Command3 |
| 0 | 1 | Serial Shift Register, Command3 |
| X | 6 | Manual Mode, Command0 |
| X | 0 | Recirculate the last TDI value, Command2 and Command5 |
| X | 5 | Get Bit1 for First Sequence of Command4 |
| X | 4 | Get Bit3 for Second Sequence of Command4 |
| X | 2 | Get Bit4 for Command6 and Hold for Repeat Value |
| X | 2 | Get Bit4 for Command7 and Hold for Repeat Value |

X = Don't Care

During the first phase of command3, muxes 920 are configured such that bits 0–4 of bus 605 (TMS pattern) are loaded in parallel into the flip-flops 910e–910a with 910a having the LSB. Flip-flop 910f receives a duplicate of bit4 (bus 605). Muxes 920 are then configured to allow the TMS bits shift through flip-flops 910 in serial fashion and shift over bus 580b via 910a. In synchronization with the above serial shift process, the TCK generator unit 640 generates n TCK clock transitions, where n=5 in one embodiment. It is appreciated that TMS generator circuit 660 can be implemented to process more or less than five bits for command3 by adding flip-flops or using only the downstream flip-flops. For command2 and command5, TDI data is output by unit 650, so the last TMS value that is held in flip-flop 910a is recirculated for each TCK pulse over the repeat value.

For command0, the manually entered TMS value is supplied over bus 609 (FIG. 9) and stored into flip-flop 910a and output over line 580b in synchronization with one TCK pulse. For command6 and command7, bit4 of bus 605 is input to flip-flop 910a and held there for a number of TCK pulses defined by the repeat value maintained by the TCK generator unit 640. A recirculation configuration (see Table III) can be used for the above function. For command4, the TMS value of bit1 (bus 605) is stored in flip-flop 910a and output, next the TMS value of bit3 (bus 605) is stored in flip-flop 910a and output. This process is repeated if bit4 (bus 605) is set one or two TCK pulses are used depending on the repeat value).

Software Procedure 415

A number of different software procedures 415 can be used to translate configuration information 410 (e.g., in a JEDEC, JESD3-C, format) into SPU compressed instructions 420 depending on the expected sequences of the configuration information 410. This is the case because the instruction formats provided above are very robust in that they are implemented to transfer any combination of configuration data. Below is an exemplary pseudo code representation of one such procedure 415 (FIG. 3) that is used by one embodiment of the present invention to perform the translation of configuration data into compressed instructions. This pseudo code procedure is effective in providing data compression by transforming configuration data into associated instruction words.

Procedure 415 is stored as code in computer readable memory of system 112 and when executed causes system 112 to translate configuration information into SPU instructions (e.g., command words). In this example "CW" refers to command word (e.g., as described above), THIS_TMS is the currently read TMS value, THIS_TDI is the currently read TDI value, LAST_TMS is the previously read TMS value, and LAST_TDI is the previously read TDI value. Storage commands in the pseudo code refer to storing information within one of the computer readable memories of system 112. Within host system 112, the TDI data and TMS data to be shifted over interface 250 have been assembled in a data structure allowing sequential serial access to each bit value. The TDI and TMS data have been synchronized so that both the TDI and TMS values required at a particular clock cycle are available simultaneously.

---

Example Pseudo-code for Process 415

---

```
while (there is JESD3-C data to process) do
    if (this is the first TDI/TMS data) then
        Begin using CW3.
        Store CW3 as CURRENT_COMMAND
        Store TDI as LAST_TDI
        Store TMS as LAST_TMS
    else
        // This is every other TMS/TDI value
        // read after the first pair
        if (CURRENT_COMMAND == CW2) then
            if (THIS_TMS == LAST_TMS) then
                ADD THIS_TMS to CW2.
                if (number of TMS's specified == 5) then
                    if (all TMS values are 1) or
                       (all TMS values are 0) then
                        repackage data as CW5 with a count of 5
                        CURRENT_COMMAND = CW5
                    else
                        Complete this CW2.
                        Continue processing using
                            CURRENT_COMMAND = CW2.
                    end if
                end if
            else
                // Fewer than 5 TMS values have been processed
                // so repackage the already processed TMS values
                // as a sequence of CW5's
                foreach (TMS bit in the already processed CW2) do
                    if (previous CW2 TMS bit == this CW2 TMS bit)
                        Build CW5 with TMS = TMS bit
                        Increment CW5 repeat count
                    else
                        Save previous CW5.
                        Build new CW5 with TMS = TMS bit
                        Set CW5 repeat count = 1
                    end if
                end foreach
                if (THIS_TDI == LAST_TDI) then
                    //
                    // Only TMS has changed
                    //
                    Build new CW3 with TMS = THIS_TMS
                    CURRENT_COMMAND = CW3
                else
                    Build new CW7 with TMS = THIS_TMS
                    and TDI = THIS_TDI
                    CURRENT_COMMAND = CW7
                end if
            end if
        else
            if (CURRENT_COMMAND == CW3) then
                if (THIS_TDI == LAST_TDI) then
                    ADD THIS_TDI to CW3.
                    if (number of TDI's specified == 5) then
                        if (all TDI values are 1) or
                           (all TDI values are 0) then
                            repackage data as CW6 with a count of 5
                            CURRENT_COMMAND = CW6
                        else
                            Save this CW3.
                            Continue processing using
                                CURRENT_COMMAND = CW3.
                        end if
                    end if
                else
                    // Fewer than 5 TDI values have been processed
                    // so repackage the already processed TMS values
                    // as a sequence of CW5's
                    foreach (TDI bit in the already processed CW3) do
                        if (previous CW3 TDI bit == this CW3 TDI bit)
                            Build CW6 with TDI = TDI bit
                            Increment CW6 repeat count
                        else
                            Save previous CW6.
                            Build new CW6 with TDI = TDI bit
                            Set CW6 repeat count = 1
                        end if
                    end foreach
                    if (THIS_TMS == LAST_TMS) then
                        //
                        // Only TDI has changed
                        //
                        Build new CW2 with TDI = THIS_TDI
                        CURRENT_COMMAND = CW2
                    else
                        Build new CW7 with TMS = THIS_TMS
                        and TDI = THIS_TDI
                        CURRENT_COMMAND = CW7
                    end if
                end if
            else
                if (CURRENT_COMMAND == CW5) then
                    if (THIS_TMS == LAST_TMS) then
                        if (THIS_TDI == LAST_TDI) then
                            increment CW5 repeat count
                            if (repeat count == MAXIMUM) then
                                Save current CW5.
                                Build new CW5 with TDI =
                                    THIS_TDI and repeat count = 1
                            end if
                        else
                            Save current CW5.
                            Build new CW5 with TDI = THIS_TDI
                            and repeat count = 1
                        end if
                    else
                        Save current CW5.
                        if (THIS_TDI == LAST_TDI) then
                            Build new CW3 with TMS = THIS_TMS
                            CURRENT_COMMAND = CW3
                        else
                            Build new CW7 with TMS = THIS_TMS
                            and TDI = THIS_TDI
                            CURRENT_COMMAND = CW7
                        end if
                    end if
                else
```

-continued

Example Pseudo-code for Process 415

```
if (CURRENT_COMMAND == CW6) then
    if (THIS_TDI == LAST_TDI) then
        if (THIS_TMS == LAST_TMS) then
            increment CW6 repeat count
            if (repeat count == MAXIMUM) then
                Save current CW6.
                Build new CW6 with TMS =
                    THIS_TMS and repeat count = 1
            end if
        else
            Save current CW6.
            Build new CW6 with TMS = THIS_TMS
                and repeat count = 1
        end if
    else
        Save current CW6.
        if (THIS_TMS == LAST_TMS) then
            Build new CW2 with TDI = THIS_TDI
            CURRENT_COMMAND = CW2
        else
            Build new CW7 with TMS = THIS_TMS
                and TDI = THIS_TDI
            CURRENT_COMMAND = CW7
        end if
    end if
else
    if (CURRENT_COMMAND == CW7) then
        if (THIS_TDI == LAST_TDI) then
            if (THIS_TMS == LAST_TMS) then
                increment CW7 repeat count
                if (repeat count == MAXIMUM) then
                    Save current CW7.
                    Build new CW7 with TDI =
                        THIS_TDI and TMS = THIS_TMS
                        and repeat
                        count = 1
                end if
            else
                Save current CW7.
                Build new CW3 with TMS = THIS_TMS
                CURRENT_COMMAND = CW3
            end if
        else
            Save current CW7.
            if (THIS_TMS == LAST_TMS) then
                Build new CW2 with TDI = THIS_TDI
                CURRENT_COMMAND = CW2
            else
                Build new CW7 with TMS = THIS_TMS
                    and TDI = THIS_TDI
                CURRENT_COMMAND = CW7
            end if
        end if
    end
    end if
    LAST_TDI = THIS_TDI
    LAST_TMS = THIS_TMS
end while
```

In the above, "==" represents a check for equivalence and "=" represents an assignment of the right hand variable to the left hand variable.

The preferred embodiment of the present invention, system for interfacing (e.g., a general purpose host computer system) to a test access port of the IEEE 1149.1 standard, is thus described. While the present invention is described in particular embodiments, it should be appreciated that the present invention should not be construed as limited by such embodiments, but rather construed according to the below claims.

What is claimed is:

1. An interface circuit comprising:

a receiver circuit for receiving instructions over a first interface, said first interface for communicating with a general purpose host computer system, said general purpose host computer system generating said instructions in a predetermined data compressed format; and a control circuit for decoding said instructions and responsive thereto for generating first signals for transmission over a second interface and for receiving second signals from said second interface; and said second interface and said first and said second signals conforming to a JTAG communication interface, wherein said second interface is for interfacing for communication with an access port of a target device, said access port conforming to said JTAG communication interface.

2. An interface circuit as described in claim 1 wherein said target device is a programmable integrated circuit and wherein said instructions represent configuration information for said programmable integrated circuit.

3. An interface circuit as described in claim 2 wherein said programmable integrated circuit is a Complex Programmable Logic Device (CPLD).

4. An interface circuit as described in claim 2 wherein said programmable integrated circuit is a Field Programmable Gate Array (FPGA).

5. An interface circuit as described in claim 1 wherein said first signals comprise TDI signals, TMS signals and TCK signals and wherein said second signals comprise TDO signals.

6. An interface circuit as described in claim 5 wherein said control circuit comprises:

a decoder for decoding said instructions from said first interface and for generating command signals responsive thereto;

a control unit coupled to receive said command signals and for generating first, second and third control signals responsive thereto;

a TCK generator circuit coupled to said instruction data bus and coupled to receive said first control signals for generating said TCK signals over said second interface in response to decoded first and second instructions;

a TDI generator circuit coupled to said instruction data bus and coupled to receive said second control signals for generating said TDI signals over said second interface in response to said first instructions; and a TMS generator circuit coupled to said instruction data bus and coupled to receive said third control signals for generating said TMS signals over said second interface in response to said second instructions.

7. An interface circuit as described in claim 6 wherein said first instructions comprise:

a first command word for indicating a TDI bit pattern for output over said second interface; and a second command word for indicating a single TDI value to be repeated over said second interface a number of times defined by an incorporated repeat value.

8. An interface circuit as described in claim 7 wherein said second instructions comprise:

a third command word for indicating a TMS bit pattern for output over said second interface; and a fourth command word for indicating a single TMS value to be repeated over said second interface a number of times defined by an incorporated repeat value.

9. An interface circuit as described in claim 1 further comprising an output signal capture circuit for capturing said second signals output from said target device over a TDO line of said second interface, said output signal capture circuit comprising:

a memory unit for storing TDO information;

an address circuit coupled to said memory unit for addressing locations of said memory unit; and a temporary buffer coupled to said memory unit and coupled to receive serial TDO information over said TDO line, said temporary buffer for generating parallel TDO information for storage to said memory unit.

10. An interface circuit comprising:

a receiver circuit for receiving instructions over a first interface, said first interface for communicating with a general purpose host computer system, said general purpose host computer system generating said instructions in a predetermined data compressed format;

a control circuit for decoding said instructions and responsive thereto for generating TCK, TDI, and TMS signals for transmission over a second interface and for receiving second signals from said second interface, said control circuit comprising:

a TCK generator circuit coupled to an instruction data bus and coupled to receive first control signals for generating said TCK signals over said second interface in response to decoded first and second instructions;

a TDI generator circuit coupled to said instruction data bus and coupled to receive second control signals for generating said TDI signals over said second interface in response to said first instructions; and a TMS generator circuit coupled to said instruction data bus and coupled to receive third control signals for generating said TMS signals over said second interface in response to said second instructions; and wherein said second interface and said first and said second signals are for communicating with an access port of a programmable integrated circuit device and conform to the IEEE 1149.1 communication standard.

11. An interface circuit as described in claim 10 wherein said control circuit further comprises:

a decoder for decoding said instructions from said first interface and for generating command signals responsive thereto;

a control unit coupled to receive said command signals and for generating said first, second and third control signals responsive thereto, said control unit coupled to said TCK, TDI, and TMS generator circuits.

12. An interface circuit as described in claim 10 wherein said first instructions comprise:

a first command word for indicating a TDI bit pattern for output over said second interface; and a second command word for indicating a single TDI value to be repeated over said second interface a number of times defined by an incorporated repeat value, and wherein said second instructions comprise:

a third command word for indicating a TMS bit pattern for output over said second interface; and a fourth command word for indicating a single TMS value to be repeated over said second interface a number of times defined by an incorporated repeat value.

13. An interface circuit as described in claim 10 further comprising an output signal capture circuit for capturing said second signals output from said programmable integrated circuit over a TDO line, said output signal capture circuit comprising:

a memory unit for storing TDO information;

an address circuit coupled to said memory unit for addressing locations of said memory unit; and a temporary buffer coupled to said memory unit and coupled to receive serial TDO information over said TDO line, said temporary buffer for generating parallel TDO information for storage to said memory unit.

14. An interface circuit as described in claim 10 wherein said instructions represent configuration information for programming said programmable integrated circuit device.

15. A communication system comprising:

a) a general purpose host computer system for translating information stored in a first format to a compressed format, said compressed format comprising a set of instructions;

b) a hardware unit comprising:

a receiver circuit for receiving instructions of said compressed format over a first interface, said first interface coupled to said general purpose host computer system; and a control circuit for decoding said instructions and responsive thereto for generating first signals for transmission over a second interface and for receiving second signals from said second interface; and wherein said second interface and said first and said second signals conform to a JTAG communication interface; and c) a programmable integrated circuit comprising an access port, wherein said second interface is for interfacing for communication with said access port.

16. A communication system as described in claim 15 wherein said first signals comprise TDI signals, TMS signals and TCK signals and wherein said second signals comprise TDO signals and wherein said control circuit comprises:

a TCK generator circuit coupled to receive an instruction data bus and coupled to receive first control signals for generating said TCK signals over said second interface in response to decoded first and second instructions;

a TDI generator circuit coupled to receive said instruction data bus and coupled to receive said second control signals for generating said TDI signals over said second interface in response to said first instructions; and a TMS generator circuit coupled to receive said instruction data bus and coupled to receive said third control signals for generating said TMS signals over said second interface in response to said second instructions.

17. A communication system as described in claim 16 wherein said control circuit further comprises:

a decoder for decoding said instructions of said compressed format from said first interface and for generating command signals responsive thereto; and a control unit coupled to receive said command signals and for generating said first, second and third control signals responsive thereto.

18. A communication system as described in claim 15 wherein said hardware unit further comprises an output signal capture circuit for capturing said second signals output from said programmable integrated circuit over a TDO line of said second interface, said output signal capture circuit comprising:

a memory unit for storing TDO information;

an address circuit coupled to said memory unit for addressing locations of said memory unit; and a temporary buffer coupled to said memory unit and coupled to receive serial TDO information over said TDO line, said temporary buffer for generating parallel TDO information for storage to said memory unit.

19. In a communication system, a method of loading configuration information into a programmable integrated circuit, said method comprising the steps of:

translating configuration information stored in a first format to a compressed format, said compressed format comprising a set of instructions, said step of translating performed using a general purpose host computer system;

receiving instructions of said compressed format over a first interface that is coupled to said general purpose host computer system and a hardware unit, said step of receiving performed by said hardware unit;

decoding said instructions received by said receiver circuit and responsive thereto generating first signals for transmission over a second interface;

receiving second signals from said second interface and storing said second signals, said above steps of decoding, generating, receiving and storing performed by said hardware unit; and wherein said second interface and said first and said second signals conform to a JTAG communication interface and wherein further said second interface is for communicating with an access port of a programmable integrated device coupled to said hardware unit.

20. A communication method as described in claim 19 wherein said step of generating first signals comprises the steps of:

decoding said instructions from said first interface and generating first, second and third control signals in response thereto;

based on said first control signals, generating TCK signals over said second interface in response to decoded first and second instructions;

based on said second control signals, generating said TDI signals over said second interface in response to said first instructions; and based on said third control signals, generating said TMS signals over said second interface in response to said second instructions.

21. A communication method as described in claim 20 wherein said first instructions comprise:

a first command word for indicating a TDI bit pattern for output over said second interface; and a second command word for indicating a single TDI value to be repeated over said second interface a number of times defined by an incorporated repeat value, and wherein said second instructions comprise:

a third command word for indicating a TMS bit pattern for output over said second interface; and a fourth command word for indicating a single TMS value to be repeated over said second interface a number of times defined by an incorporated repeat value.

* * * * *

UNITED STATES PATENT AND TRADEMARK OFFICE
CERTIFICATE OF CORRECTION

PATENT NO.   : 5,694,399
DATED        : 12-02-97
INVENTOR(S)  : Neil G. Jacobson, Anthony S. Maraldo It is certified that error appears in the above-identified patent and that said Letters Patent is hereby corrected as shown below:

Col. 15, line 59, "CWS" should read --CW5--.

Signed and Sealed this

Thirty-first Day of August, 1999

Attest:

Q. TODD DICKINSON

*Attesting Officer*   *Acting Commissioner of Patents and Trademarks*

UNITED STATES PATENT AND TRADEMARK OFFICE
CERTIFICATE OF CORRECTION

PATENT NO.   : 5,694,399
DATED        : December 2, 1997
INVENTOR(S)  : Neil G. Jacobson and Anthony S. Maraldo It is certified that error appears in the above-identified patent and that said Letters Patent is hereby corrected as shown below:

<u>Title page,</u>
Item [73], Assignee, please delete "Xilinix" and insert -- Xilinx --

Signed and Sealed this

Thirtieth Day of December, 2003

JAMES E. ROGAN
*Director of the United States Patent and Trademark Office*